(12) United States Patent
Ju et al.

(10) Patent No.: US 7,253,068 B1
(45) Date of Patent: Aug. 7, 2007

(54) DUAL SOI FILM THICKNESS FOR BODY RESISTANCE CONTROL

(75) Inventors: Dong-Hyuk Ju, Cupertino, CA (US); Srinath Krishnan, Campbell, CA (US); Mario Pelella, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 76 days.

(21) Appl. No.: 10/834,095

(22) Filed: Apr. 29, 2004

(51) Int. Cl.
*H01L 21/331* (2006.01)

(52) U.S. Cl. .................... 438/311; 438/218; 438/219

(58) Field of Classification Search ............ 257/347, 257/352; 438/311, 218, 219
See application file for complete search history.

(56) References Cited

U.S. PATENT DOCUMENTS 6,281,593 B1 * 8/2001 Brown et al. ............... 257/213
6,492,209 B1 * 12/2002 Krishnan et al. ........... 438/149
6,724,046 B2 * 4/2004 Oyamatsu .................. 257/347

* cited by examiner

*Primary Examiner*—Sara Crane
(74) *Attorney, Agent, or Firm*—McDermott Will & Emery

(57) ABSTRACT

The silicon-on-insulator (SOI) arrangement provides dual SOI film thicknesses for body-resistance control and provides a bulk silicon substrate on which a buried oxide (BOX) layer is provided. The BOX layer has recesses formed therein and unrecessed portions. The silicon layer is formed on the BOX layer and closes the recesses and covers the unrecessed portions of the BOX layer. Shallow trench isolation regions define and isolate first silicon regions from second silicon regions that each include one of the recesses. Floating-body devices are formed within the first silicon regions, which exhibit a first thickness, and body-tied devices are formed within the second silicon regions that include the thicker silicon of the recesses.

14 Claims, 2 Drawing Sheets

DUAL SOI FILM THICKNESS FOR BODY RESISTANCE CONTROL

FIELD INVENTION

The present invention relates to the field of semiconductor processing, and more particularly, to the formation of floating-body devices and body-tied devices on silicon-on-insulator (SOI) film.

BACKGROUND OF THE INVENTION

As is known in the art, transistors such as metal oxide semiconductor (MOS) transistors, have been formed in isolated regions of a semiconductor body such as an epitaxial layer, which was itself formed on a semiconductor, typically a bulk silicon substrate. With an n-channel MOS field effect transistor (FET), the body is of p-type conductivity and the source/drain regions are formed in the p-type conductivity body as $N^+$ type conductivity regions. With p-channel MOSFET, the body or epitaxial layer, is of n-type conductivity and the source and drain regions are formed in the n-type conductivity body as $P^+$ type conductivity regions. It has been suggested that the semiconductor body, or layer, be formed on an insulating substrate, or over an insulation layer formed in a semiconductor substrate. Such technology is sometimes referred to as silicon-on-insulator (SOI) technology. The SOI MOS technologies have a number of advantages over bulk silicon MOS transistors. These advantages include: reduced source/drain capacitance and hence improved speed performance at higher-operating frequencies; reduced $N^+$ to $P^+$ spacing and hence, higher packing density due to ease of isolation; and higher "soft error" upset immunity (i.e., the immunity to the effects of alpha particle strikes).

Silicon-on-insulator technology is characterized by the formation of a thin silicon layer for formation of the active devices over an insulating layer, such as an oxide, which is in turn formed over a substrate. Transistor sources and drains are formed by, for example, implantation into the silicon layer while transistor gates are formed by a patterned conductor (i.e., polysilicon). Such structure is provided significant gain in performance by having lower parasitic capacitance (due to the insulator layer) and increased drain current due to floating body charging effects (since no connection is made to the channel region and charging of the floating body provides access towards the majority of carriers which dynamically lower the threshold voltage, at resulting in increased drain current). However, the floating body can introduce dynamic instabilities in the operation of such a transistor.

Floating-body transistors predicated on thin SOI films exhibit good performance. The body resistance of conventional SOI body-tied transistors is quite high, leading to the degradation of body-tied transistor performance. It's preferable to provide thick SOI films for use with body-tied transistors in order to lower the body resistance of the body-tied transistors.

SUMMARY OF THE INVENTION

There is a need for a method of forming floating-body transistors on thin SOI films while also forming body-tied transistors on thick SOI films on the same substrate. This and other needs are met by embodiments of the present invention which provide a method of forming floating-body devices and body-tied devices on silicon-on-insulator (SOI) films and comprising the steps of forming recesses in a buried oxide (BOX) layer. Silicon is deposited on a BOX layer and in the recesses. Shallow trench isolation (STI) formations are created on the BOX layer to thereby form first silicon regions having a first thickness and second silicon regions having a second thickness greater than the first thickness. The second silicide regions include silicon deposited in the recesses of the BOX layer. The floating-body devices are formed in the first silicon regions and the body-tied devices are formed in the second silicon regions.

By providing for the fabrication of the floating-body transistors on a thin SOI film region, the good performance of floating-body devices is maintained. At the same time, the body resistance of the body-tied transistors is lowered by the fabrication of the body-tied transistors on a thick SOI film. This is accomplished by providing the thin and thick SOI films on the same substrate in the manner of the present invention.

The earlier stated needs are also met by other embodiments of the present invention which provide a method of forming semiconductor devices comprising the steps of forming first silicon regions on a BOX layer of a SOI precursor, the first silicon regions having a first thickness. Second silicon regions are formed on the BOX layer having a second thickness greater than the first thickness. The first and second silicon regions are isolated from each other. Floating-body devices are formed in the first regions and body-tied devices are formed in the second regions.

The earlier stated needs are also met by embodiments of the present invention which provide for a silicon-on-insulator (SOI) arrangement comprising a bulk silicon substrate and an insulator layer on the substrate. The insulator layer has recesses and unrecessed portions. A silicon layer is provided on the insulator layer. The silicon layer fills the recesses and covers the unrecessed portions of the insulator layer. Shallow trench isolation (STI) regions are provided on the unrecessed portions of the insulator layer. The STI regions define and isolate first silicon regions located entirely on one of the unrecessed portions from second silicon regions that each includes one of the recesses.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses problems related to the formation of floating-body devices and body-tied devices on SOI films. In particular, the present invention solves these problems, in part, by forming the floating-body devices and the body-tied devices in regions of the SOI film of respective different thicknesses. In certain embodiments of the invention, the different film thicknesses are created by providing recesses in a buried oxide (BOX) layer and filling the recesses and covering the BOX layer with a silicon layer. Isolation regions are formed within the silicon layer to define the thin film areas and the thicker film areas. The floating-body devices are provided in the thin film areas and the body-tied devices are formed in the thicker film areas. This maintains the good performance of the floating-body devices while lowering the body resistance of the body-tied devices.

Figure 1:
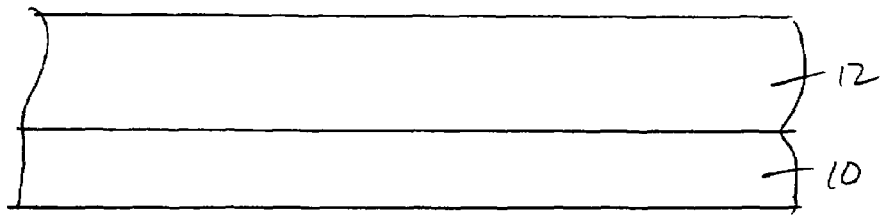
FIG. 1 is a schematic depiction of a cross-section of a SOI precursor for use in the method of formation of an arrangement in accordance with embodiments of the present invention.

FIG. 1 depicts a SOI precursor formed in accordance with embodiments of the present invention. The precursor has a bulk silicon substrate 10 on which an insulator layer 12 is provided. In certain embodiments of the invention, the insulator layer is formed of oxide. This layer may also be referred to as a buried oxide (BOX) layer 12. The thicknesses of the silicon substrate 10 and the BOX layer 12 may be conventional. For example, the BOX layer 12 may be between about 2000 to about 4000 angstroms thick. Conventional methods for forming the precursor may be employed.

Figure 2:
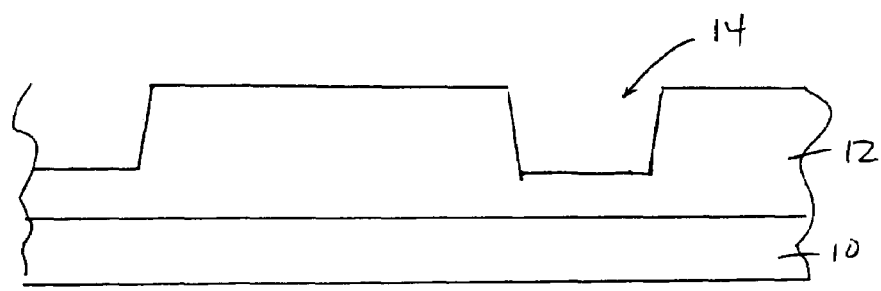
FIG. 2 shows the structure of FIG. 1 following the etching of a buried oxide layer in accordance with embodiments of the present invention.
Figure 3:
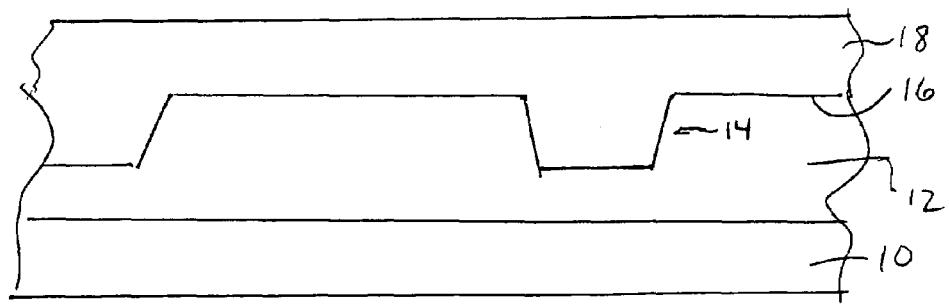
FIG. 3 depicts the structure of FIG. 2 after silicon has been deposited on the buried oxide layer in accordance with embodiments of the present invention.
Figure 4:
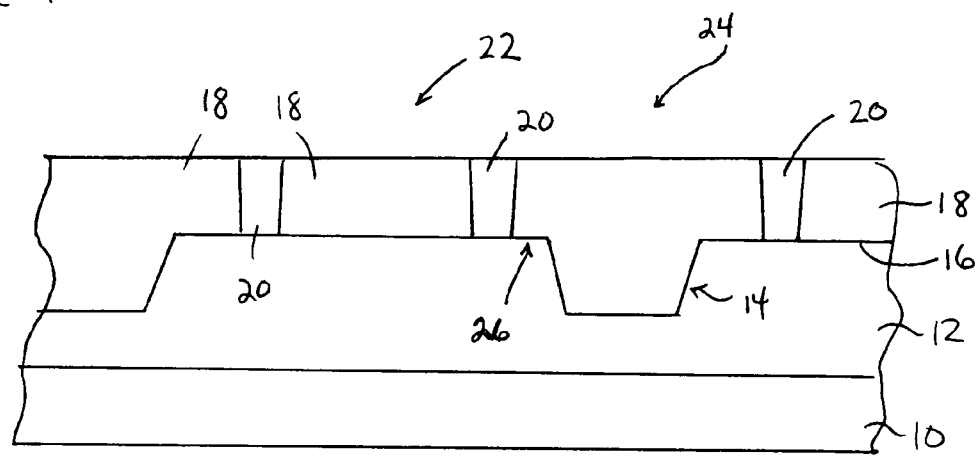
FIG. 4 shows the structure of FIG. 3 following the formation of isolation regions in the silicon layer in accordance with embodiments of the present invention.

In FIG. 2, an etch process has been performed to create recesses 14 in the BOX layer 12. The etch process may be a conventional etch process, including forming a mask and performing an anisotrophic etch of the BOX layer 12 to a desired depth. When the mask is removed, recesses 14 remain in the BOX layer 12 as well as unrecessed portions 16. An exemplary depth of the recesses 14 is between about 1000 to about 2000 angstroms.

Following the formation of the recesses 14 and the unrecessed portions 16 in the BOX layer 12, a silicon layer 18 is deposited by a conventional deposition process over the BOX layer 12. Hence, the silicon layer 18 closes the recesses 14 and covers the unrecessed portions 16 of the BOX layer 12. The thickness of the silicon layer 18 in those areas over the unrecessed portion 16 is between about 500 to about 1500 angstroms. In those areas over the recesses, the silicon layer 18 is between about 1500 to about 3500 angstroms thick. These thicknesses are exemplary only, as other thicknesses may be used without departing from the present invention.

Following the formation of the silicon layer 18, isolation regions 20 are formed in the silicon layer 18. The isolation regions 20 may be shallow trench isolation (STI) regions 20. A conventional STI technique may be employed to form the isolation regions 20. For example, a masking and etching of the silicon layer may be performed, followed by deposition of an isolating material, such as oxide, into the etched portions of the silicon layer 18.

The isolation regions 20 define and isolate from one another first silicon regions 22 and second silicon regions 24. First silicon regions 22 are characterized by being located entirely on unrecessed portions 16 of the BOX layer 12. By contrast, the second silicon regions 24 are characterized by inclusion of a recessed 14 in the BOX layer. Hence, the first silicon regions 22 exhibit a first thickness of between about 500 to about 1500 angstroms, while the second silicon regions 24 exhibit a second thickness of between about 1500 to about 3500 angstroms.

In addition to the recess 14, the silicon regions 24 are also partially formed on the unrecessed portions 16 of the BOX layer 12, in certain embodiments of the present invention.

Following the formation of the first and second silicon regions 22, 24 the formation of the floating-body devices and body-tied devices is performed. Conventional device formation techniques may be employed, such as implantation of dopants to form source/drain extensions, the formation of the gate electrodes, etc. Hence, a floating-body transistor 28 is created in the first silicon regions 22. Body-tied transistors 30 are created in the second silicon regions 24. Each of the devices 28, 30 have source/drain regions 32 and gate electrodes 34 on a gate oxide layer 36, as depicted in FIG. 5.

Figure 5:
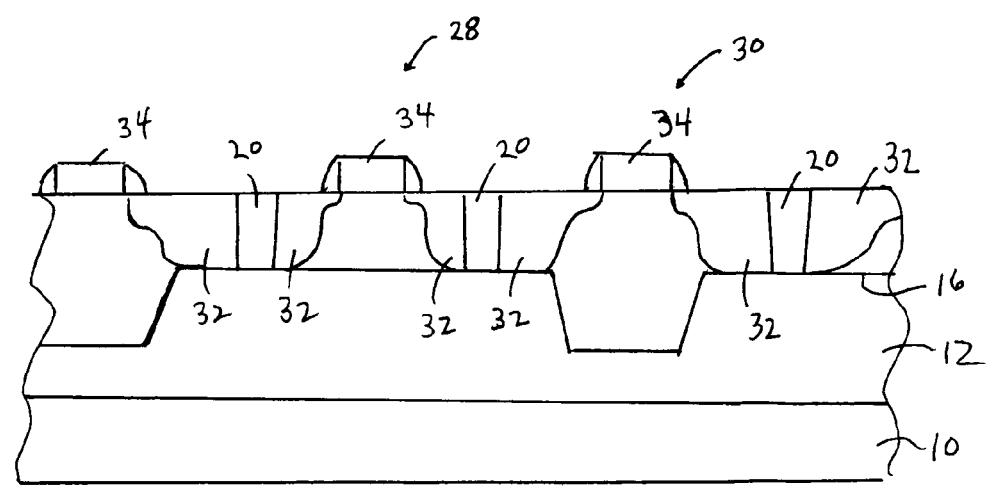
FIG. 5 shows the structure of FIG. 4 following the formation of the devices in accordance with embodiments of the present invention.

As can be understood from FIG. 5, the floating-body transistor 28 is provided on a relatively thin SOI film, while at the same time, the body-tied transistors 30 are provided on a relatively thicker SOI film. This is achieved, however, on a single substrate. Thus, the good performance of floating-body transistors as well as the lowered body resistance for body-tied transistors are achievable on the same substrate in accordance with embodiments of the present invention.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of forming floating-body devices and body-tied devices on a silicon-on-insulator (SOI) film; comprising the steps of:
   forming recesses in a buried oxide (BOX) layer;
   depositing silicon on the BOX layer and in the recesses;
   forming shallow trench isolation (STI) formations BOX the BOX layer to thereby form first silicon regions having a first thickness and second silicon regions having a second thickness greater than the first thickness, the second silicon regions including the silicon deposited in the recesses of the BOX layer; and
   forming the floating-body devices in the first silicon regions and the body-tied devices in the second silicon regions.

2. The method of claim 1, wherein the first silicon regions are formed on unrecessed portions of the BOX layer.

3. The method of claim 2, wherein the first thickness is between about 500 to about 1500 Å.

4. The method of claim 3, wherein the second thickness is between about 1500 to about 3500 Å.

5. The method of claim 4, wherein the second silicide regions include source/drain areas formed on unrecessed portions of the BOX layer.

6. A method of forming semiconductor devices, comprising the steps of:
   forming first silicon regions on a buried oxide (BOX) layer of a silicon-on-insulator (SOI) precursor, the first silicon region having a first thickness;
   forming second silicon regions on the BOX layer having a second thickness greater than the first thickness;
   isolating the first and second silicon regions from each other; and
   forming floating-body devices in the first regions and body-tied devices in the second regions;
   wherein the step of isolating includes forming shallow trench isolation (STI) regions on the BOX layer;

comprising forming recessed portions and unrecessed portions in the BOX layer; wherein the steps of forming first and second silicon regions include depositing silicon in the recessed portions and on the unrecessed portions of the BOX layer.

7. The method of claim 6, wherein each second silicon region includes one of the recessed portions and at least one unrecessed portion.

8. The method of claim 7, wherein each first silicon region includes only unrecessed portions.

9. A silicon-on-insulator (SOI) arrangement, comprising:
a bulk silicon substrate;
an insulator layer on the substrate, the insulator layer having recesses and unrecessed portions;
a silicon layer and shallow trench isolation (STI) regions on the insulator layer, the silicon layer filling the recesses and covering sections of the unrecessed portions of the insulator layer, the STI regions extending through the silicon layer to the unrecessed portions of the insulator layer and extending through the silicon layer to define and isolate first silicon regions, each first silicon region located entirely on one of the unrecessed portions, from second silicon regions that each include one of the recesses.

10. The arrangement of claim 9, further comprising floating-body devices in the first silicon regions and body-tied devices in the second silicon regions.

11. The arrangement of claim 10, wherein the insulator layer is a buried oxide (BOX) layer.

12. The arrangement of claim 11, wherein the silicon layer is between about 500 Å to about 1500 Å thick on the unrecessed portions of the BOX layer.

13. The arrangement of claim 12, wherein the silicon layer is between about 1500 Å to about 3500 Å thick on the recesses.

14. The arrangement of claim 13, wherein the second silicon regions also include silicon on unrecessed portions of the BOX layer.

* * * * *